US008750919B2

(12) United States Patent
Hwang

(10) Patent No.: US 8,750,919 B2
(45) Date of Patent: Jun. 10, 2014

(54) MOBILE TERMINAL HAVING FLEXIBLE PRINTED CIRCUIT BOARD

(75) Inventor: Won Gi Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 391 days.

(21) Appl. No.: 12/794,913

(22) Filed: Jun. 7, 2010

(65) Prior Publication Data
US 2011/0003622 A1 Jan. 6, 2011

(30) Foreign Application Priority Data

Jul. 6, 2009 (KR) ........................ 10-2009-0060976

(51) Int. Cl.
H04M 1/00 (2006.01)
(52) U.S. Cl.
USPC .................. 455/550.1; 455/575.1; 455/575.4; 361/749
(58) Field of Classification Search
USPC ......... 455/550.1, 575.1, 575.4; 361/736, 748, 361/749, 760, 761
See application file for complete search history.

(56) References Cited

U.S. PATENT DOCUMENTS

| 7,371,090 | B2* | 5/2008 | Hashizume | 439/164 |
|---|---|---|---|---|
| 2005/0030233 | A1* | 2/2005 | Kim et al. | 343/702 |
| 2005/0237725 | A1* | 10/2005 | Cho et al. | 361/752 |
| 2006/0050490 | A1 | 3/2006 | Ootani | |
| 2007/0004471 | A1* | 1/2007 | Wang | 455/575.1 |
| 2007/0103848 | A1* | 5/2007 | Araki et al. | 361/600 |
| 2008/0062661 | A1 | 3/2008 | Choi et al. | |
| 2009/0016030 | A1* | 1/2009 | Takahashi | 361/748 |
| 2009/0021899 | A1* | 1/2009 | Chen | 361/680 |
| 2009/0052126 | A1* | 2/2009 | Komiyama | 361/679.56 |
| 2009/0137293 | A1* | 5/2009 | Yoo et al. | 455/575.4 |
| 2009/0209299 | A1* | 8/2009 | Lin et al. | 455/572 |
| 2009/0279008 | A1* | 11/2009 | Lee et al. | 349/40 |
| 2009/0296330 | A1* | 12/2009 | Ho et al. | 361/679.4 |
| 2009/0303691 | A1* | 12/2009 | Choi | 361/768 |
| 2010/0007596 | A1* | 1/2010 | Cho et al. | 345/98 |
| 2010/0159714 | A1* | 6/2010 | Zieger | 439/55 |
| 2010/0188826 | A1* | 7/2010 | Yeh | 361/749 |
| 2010/0197368 | A1* | 8/2010 | Kawate et al. | 455/575.1 |
| 2010/0290198 | A1* | 11/2010 | Rannikko et al. | 361/736 |

FOREIGN PATENT DOCUMENTS

| JP | 2006-41193 A | 2/2006 |
|---|---|---|
| JP | 2007-13014 A | 1/2007 |
| KR | 2005003265 | * 10/2005 |

* cited by examiner

Primary Examiner — Kashif Siddiqui
Assistant Examiner — Mong-Thuy Tran
(74) Attorney, Agent, or Firm — Jefferson IP Law, LLP

(57) ABSTRACT

A mobile terminal having a flexible printed circuit board is disclosed. The mobile terminal includes a first main body unit having a first electronic circuit board mounted therein, a second main body unit movably connected to the first main body unit and having a second electronic circuit board mounted therein, and a flexible printed circuit board (FPCB) for electrically connecting the first electronic circuit board and the second electronic circuit board to transmit an electric signal therebetween. The FPCB includes an FPCB connection unit, a first connector and a second connector formed at opposite ends of the FPCB connection unit and connected to the first electronic circuit board and second electronic circuit board, respectively, and a ground unit formed on the FPCB connection unit between the first connector and second connector and connected to a ground of the first electronic circuit board.

8 Claims, 6 Drawing Sheets

Section A-A'

MOBILE TERMINAL HAVING FLEXIBLE PRINTED CIRCUIT BOARD

PRIORITY

This application claims the benefit under 35 U.S.C. §119(a) of a Korean patent application filed on Jul. 6, 2009 in the Korean Intellectual Property Office and assigned Serial No. 10-2009-0060976, the entire disclosure of which is hereby incorporated by reference.

BACKGROUND OF THE INVENTION

1. Field of the Invention

The present invention relates to a mobile terminal. More particularly, the present invention relates to a mobile terminal having a flexible printed circuit board.

2. Description of the Related Art

A mobile terminal is an electronic device by which a user may freely use functions of wireless communication, network connection, and digital broadcast reception regardless of a user's time and location. Nowadays, mobile terminals have been developed to perform a variety of functions, such as Internet connection, digital broadcast reception, document writing, and game playing, in addition to voice communication. Additionally, while the functions available to mobile terminals are increasing to meet user demand, the mobile terminals themselves are becoming smaller and slimmer.

An electronic circuit board mounted with multiple electronic parts is installed in the mobile terminal. The electronic circuit board transmits and receives electrical signals to and from function modules of the mobile terminal, such as a display unit and a camera unit. As the mobile terminal becomes smaller, a Flexible Printed Circuit Board (FPCB) may be used to connect the electronic circuit board and the display unit and camera unit of the mobile terminal and transmit and receive electrical signals including various data therebetween to effectively utilize internal space of the mobile terminal. An FPCB is generally used for slide type mobile terminals.

As mobile terminals adopt high performance display units and camera units, and as data traffic between the electronic circuit board and display unit and camera unit increases and operating frequency of data expands to a high frequency region, increased radiation and ElectroStatic Discharge (ESD) effects on the mobile terminal become a concern. Because only a ground line of a pattern form is located on the FPCB, and the FPCB is connected to a ground of the electronic circuit board only through connectors formed at two ends, a sufficient ground between the electronic circuit board, the display unit, and the camera unit cannot be provided. Additionally, because a bypass path to avoid noise and ESD surges affecting the radiation ability is not provided, the shielding capability of the FPCB against noise and ESD surge is very low. Particularly, there is a problem that the ESD surge affects a ground formed in the electronic circuit board, and the possibility of damaging peripheral electronic parts is high.

Additionally, in the slide type mobile terminal, because a slidably moving upper case is assembled in a half-open state to connect the FPCB to the electronic circuit board, the assembly process is not easy and the FPCB may be broken.

Accordingly, a mobile terminal having a flexible printed circuit board is required for enabling easy assembly of the FPCB in the mobile terminal and improving radiation and ESD ability of the mobile terminal.

SUMMARY OF THE INVENTION

An aspect of the present invention is to address at least the above-mentioned problems and/or disadvantages and to provide at least the advantages described below. Accordingly, an aspect of the present invention is to provide a mobile terminal having a Flexible Printed Circuit Board (FPCB) that enables easy assembly of the FPCB in the mobile terminal and improves radiation and ESD ability of the mobile terminal.

In accordance with an aspect of the present invention, a mobile terminal having a flexible printed circuit board is provided. The mobile terminal includes a first main body unit having a first electronic circuit board mounted therein, a second main body unit movably connected to the first main body unit and having a second electronic circuit board mounted therein, and a Flexible Printed Circuit Board (FPCB) for electrically connecting the first electronic circuit board to the second electronic circuit board so as to transmit an electric signal therebetween. The flexible printed circuit board includes an FPCB connection unit having at least one data line, power line and ground line, a first connector and a second connector formed at opposite ends of the FPCB connection unit and connected to the first electronic circuit board and second electronic circuit board, respectively, and a ground unit formed on the FPCB connection unit between the first connector and second connector and connected to a ground of the first electronic circuit board.

According to another aspect of the present invention, a Flexible Printed Circuit Board (FPCB) installable in a mobile device is provided. The FPCB includes an FPCB connection unit including at least one data line, a power line, and a ground line; a first connector formed at one end of the FPCB connected to a first electronic circuit board of a mobile terminal; a second connector formed at an end of the FPCB opposite that of the end to which the first connector is formed, and connected to a second electronic circuit board of the mobile terminal; and a ground unit formed on the FPCB connection unit between the first connector and the second connector and connected to a ground of the first electronic circuit board.

According to another aspect of the present invention, a method of installing a Flexible Printed Circuit Board (FPCB) in a mobile terminal is provided. The method includes attaching a ground unit of the FPCB to a back surface of an upper cover of a lower case of the mobile terminal, arranging the FPCB such that a first connector of the FPCB protrudes from a side surface of the lower case; installing an electronic circuit board on the upper cover, and connecting the first connector to the electronic circuit board.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Although a mobile terminal according to an exemplary embodiment of the present invention is described as a mobile communication terminal for convenience of description, exemplary embodiments of the present invention are not limited thereto. A mobile terminal according to an exemplary embodiment of the present invention includes a mobile terminal having a flexible printed circuit board. Exemplary embodiments of the present invention may be applied to any information communication device and multimedia device, such as a mobile communication terminal, mobile phone, Personal Digital Assistant (PDA) terminal, smart phone, International Mobile Telecommunication (IMT) 2000 terminal, Code Division Multiple Access (CDMA) terminal, Wideband Code Division Multiple Access (WCDMA) terminal, Global System for Mobile communication (GSM) terminal, General Packet Radio Service (GPRS) terminal, Enhanced Data GSM Environment (EDGE) terminal, Universal Mobile Telecommunication Service (UMTS) terminal, digital broadcast terminal and ATM (ATM), and the like.

Figure 1:
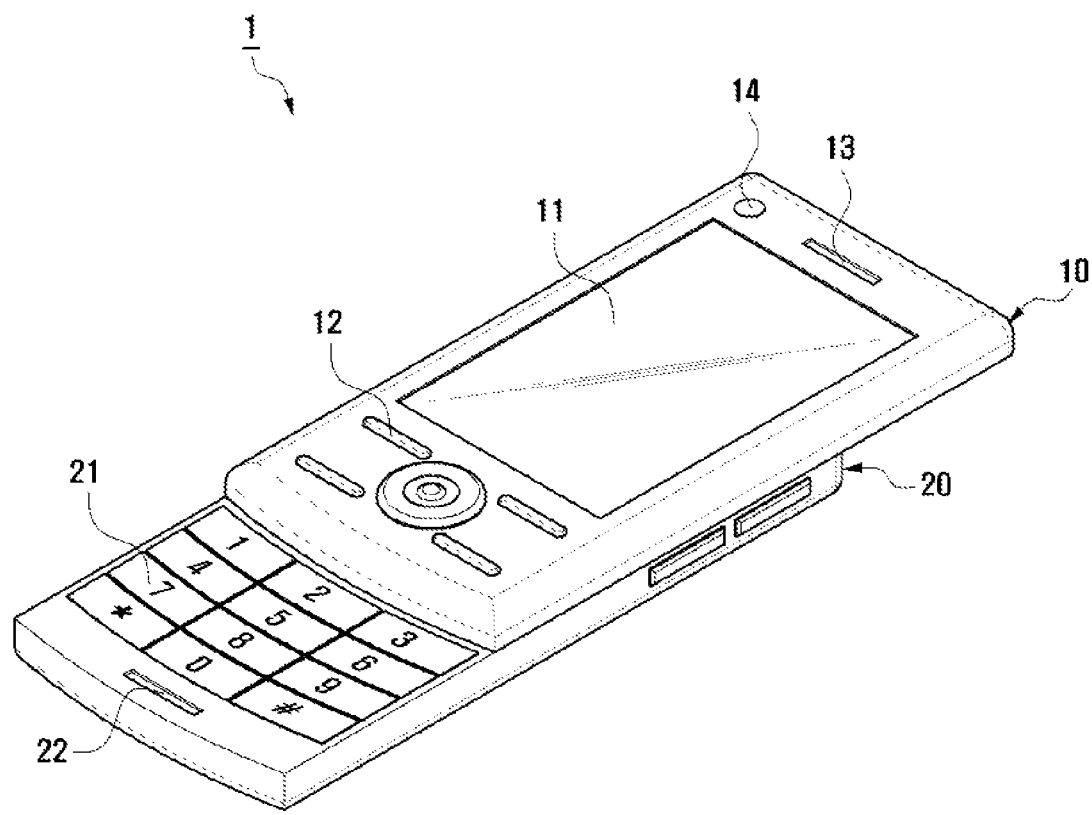
FIG. 1 is a perspective view illustrating a mobile terminal having a flexible printed circuit board according to an exemplary embodiment of the present invention.
Figure 2:
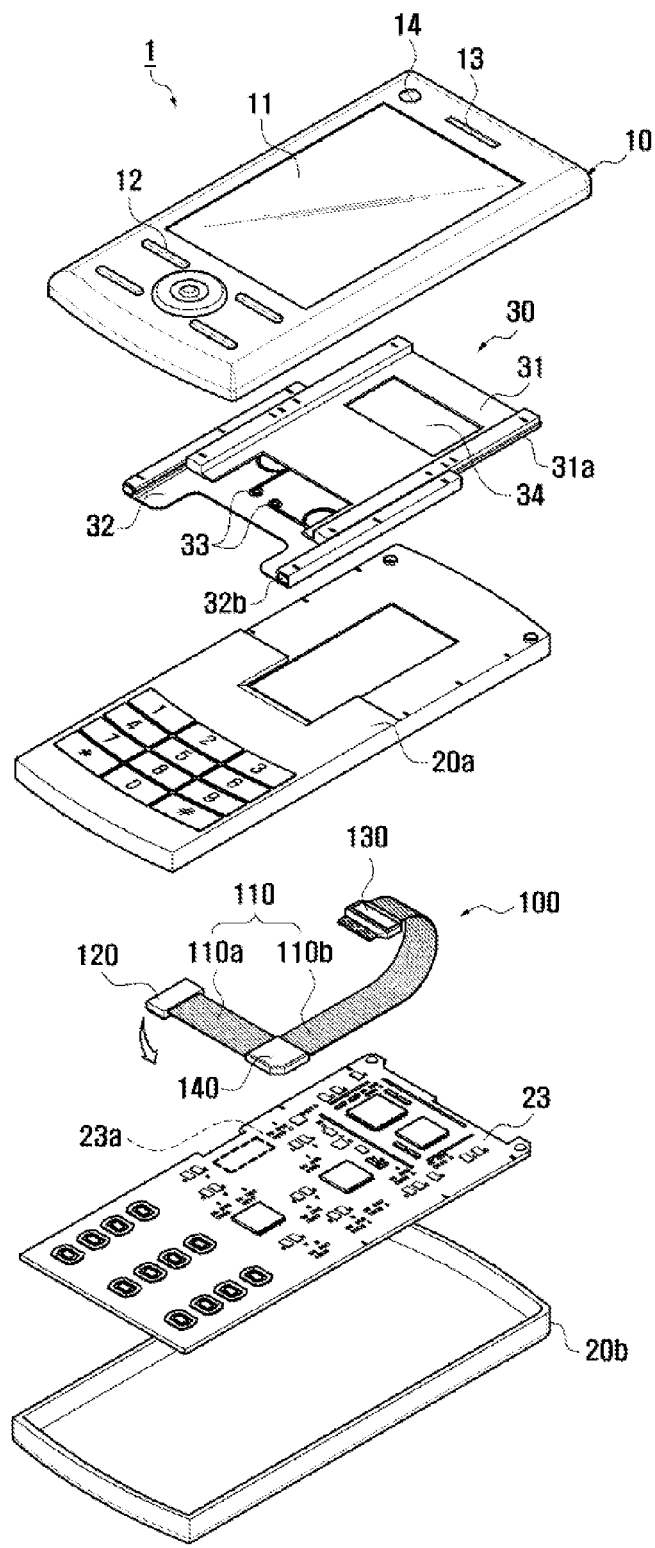
FIG. 2 is an exploded perspective view illustrating a configuration of a mobile terminal having a flexible printed circuit board according to another exemplary embodiment of the present invention.

FIG. 1 is a perspective view illustrating a mobile terminal having a flexible printed circuit board according to an exemplary embodiment of the present invention, and FIG. 2 is an exploded perspective view illustrating a configuration of a mobile terminal having a flexible printed circuit board according to another exemplary embodiment of the present invention.

Referring to FIG. 1, a slide type mobile terminal 1 has an upper case 10, including a display unit 11 on a front surface thereof, and a lower case 20, including a key input unit 21 on a front surface thereof. The upper case 10 slidably moves up and down on the lower case 20.

The display unit 11 displays a user interface that may output a desired screen to a user and receive a command input by the user. A Liquid Crystal Display (LCD) unit and an Organic Light Emitting Diode (OLED) display unit may be used for the display unit 11.

The key input unit 21 is formed on the front surface of the lower case 20 to receive a manipulation command input by the user, and is exposed when the user slidably moves the upper case 10 on the lower case 20 to expose the front surface of the lower case 20. The key input unit 21 may be, for example, a key pad or key buttons.

In the exemplary embodiment illustrated in FIG. 1, an auxiliary key input unit 12 is formed on a lower front surface of the upper case 10 adjacent to a lower side of the display unit 11, to receive a manipulation command input by the user. The display unit 11 may also be formed on an entire front surface of the upper case 10. The auxiliary key input unit 12 may be formed on the lower front surface of the upper case 10 or on a side surface thereof, and may include keys usable when the upper case 10 is positioned covering the lower case 20. Examples of the keys include function keys (such as a power key for turning a power source of the mobile terminal 1 on and off), a call key for call communication with a counterparty, and a directional key for selecting a menu from a menu list displayed on the display unit 11.

As shown in FIG. 1, the mobile terminal 1 includes a sound output unit 13 installed on an upper front surface of the upper case 10 for outputting a sound signal, and a sound input unit 22 installed on a lower front surface of the lower case 20 for inputting a sound signal. The user may listen to a sound signal received from a counterparty by moving the sound output unit 13 to the user's ear, and may input a sound signal for transmission to a counterparty by speaking into the sound input unit 22. The mobile terminal 1 may include a camera unit 14 installed in the upper case 10 for taking a picture of an object and performing video communication. The mobile terminal 1 may include an antenna unit (not shown) in a lower part of the lower case 20 for transmitting and receiving a radio signal.

Referring to FIG. 2, a sliding hinge 30 is mounted between the upper case 10 and lower case 20 to guide the upper case 10 to slidably move on the lower case 20. The sliding hinge 30 includes a first sliding member 31 connected to a back surface of the upper case 10, a second sliding member 32 connected to the front surface of the lower case 20, and a hinge unit 33 installed between the first sliding member 31 and second sliding member 32. An opening 34 is formed in the first sliding member 31. A corresponding opening (not shown) is formed in the second sliding member 32, to permit a Flexible Printed Circuit Board (FPCB) 100 to penetrate through the first and second sliding members 31 and 32. A protrusion 31a is formed along both sides of the first sliding member 31 in a movement direction of the upper case 10 to guide the sliding movement of the upper case 10. A corresponding groove 32b is formed in both sides of the second sliding member 32 to insert the protrusion 31a of the first sliding member 31. The hinge unit 33 includes an elastic member, such as a compression spring, to provide an elastic force for the upper case 10 to slidably move in an automatic or semi-automatic manner according to its location. FIG. 2 illustrates an example of a configuration of the sliding hinge 30. Exemplary embodiments of the present invention are not limited to the arrangement shown in FIG. 2; other arrangements may also be employed.

A first electronic circuit board 23 is installed in the lower case 20, and a second electronic circuit board 15 (shown in FIG. 5) is installed in the upper case 10. Various function modules installed in the upper case 10, such as the display unit 11 and camera unit 14, are electrically connected to the second electronic circuit board 15 installed in the upper case 10, and are controlled via an electrical signal from the first electronic circuit board 23 installed in the lower case 20 through the second electronic circuit board 15. The first electronic circuit board 23 and second electronic circuit board 15 have a thin plate shape, and may include various electronic parts and circuit lines on a surface thereof to connect the electronic parts. The electronic parts may be various kinds of devices, such as a modem chip. The first electronic circuit board 23 and second electronic circuit board 15 may include a Printed Circuit Board (PCB). Although not shown in the drawings, a noise shielding unit, such as a shield can, may be installed in the first electronic circuit board 23 or second electronic circuit board 15 to shield noise generated by the electronic parts. The noise may be noise generated when data are transmitted from the display unit 11 and camera unit 14, noise generated by a power source, and noise that is radiated from an antenna unit (not shown) and coupled to the upper case 10, then radiated therefrom.

As described above, various function modules connected to the second electronic circuit board 15, such as the display unit 11 and camera unit 14, are controlled by receiving an electrical signal from the first electronic circuit board 23. The FPCB 100 connects the first electronic circuit board 23 with the second electronic circuit board 15 to transmit various electrical signals therebetween. The flexible printed circuit board 100 according to an exemplary embodiment of the present invention is described with reference to FIGS. 3 to 5.

Figure 3:
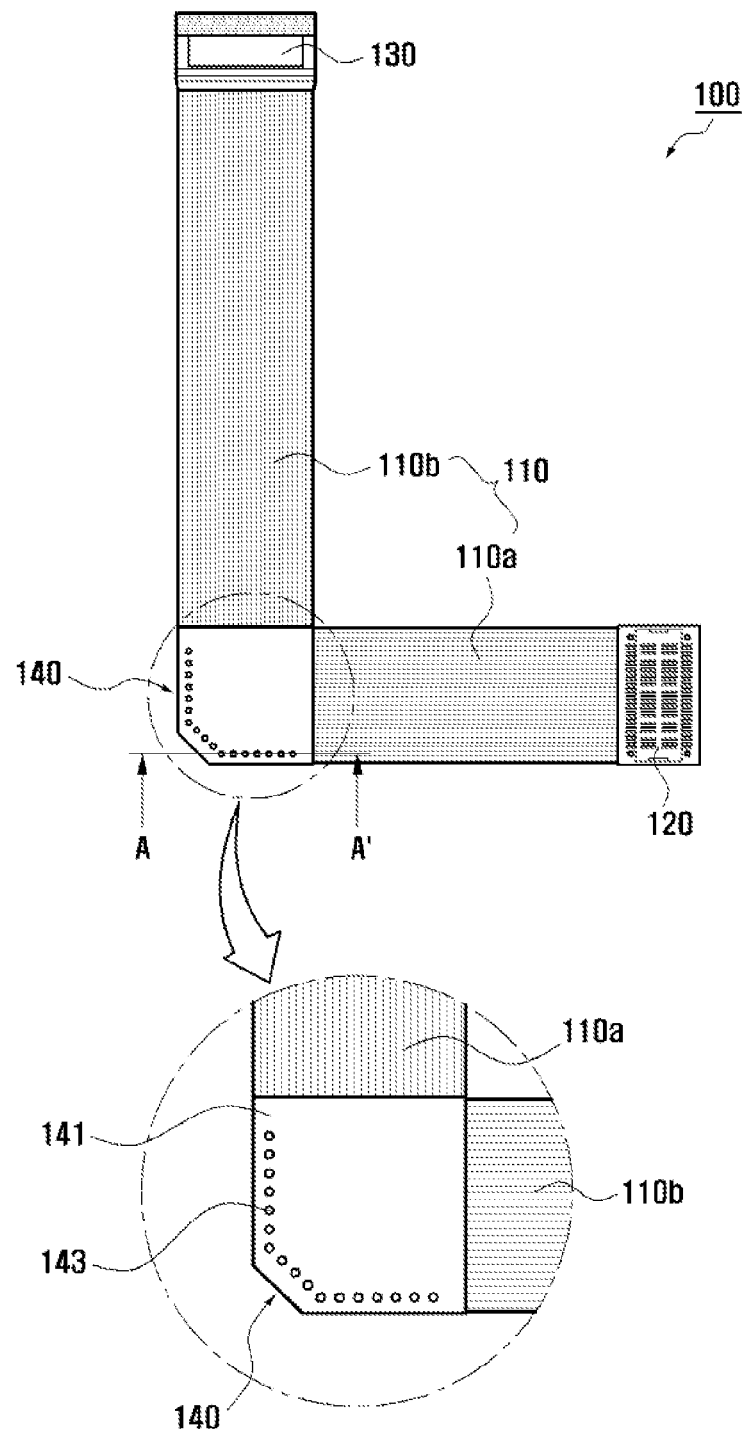
FIG. 3 is a plan view illustrating a configuration of a flexible printed circuit board in the mobile terminal having a flexible printed circuit board of FIG. 2 according to an exemplary embodiment of the present invention.
Figure 4:
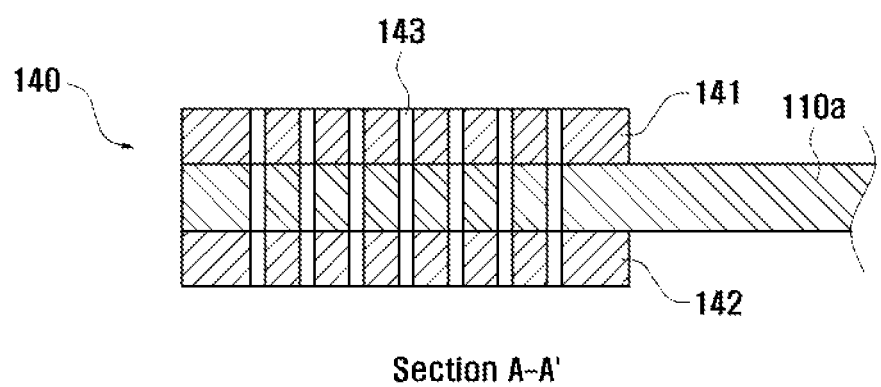
FIG. 4 is a cross sectional view illustrating the flexible printed circuit board of FIG. 3 cut along a line A-A' in FIG. 3 according to an exemplary embodiment of the present invention.
Figure 5:
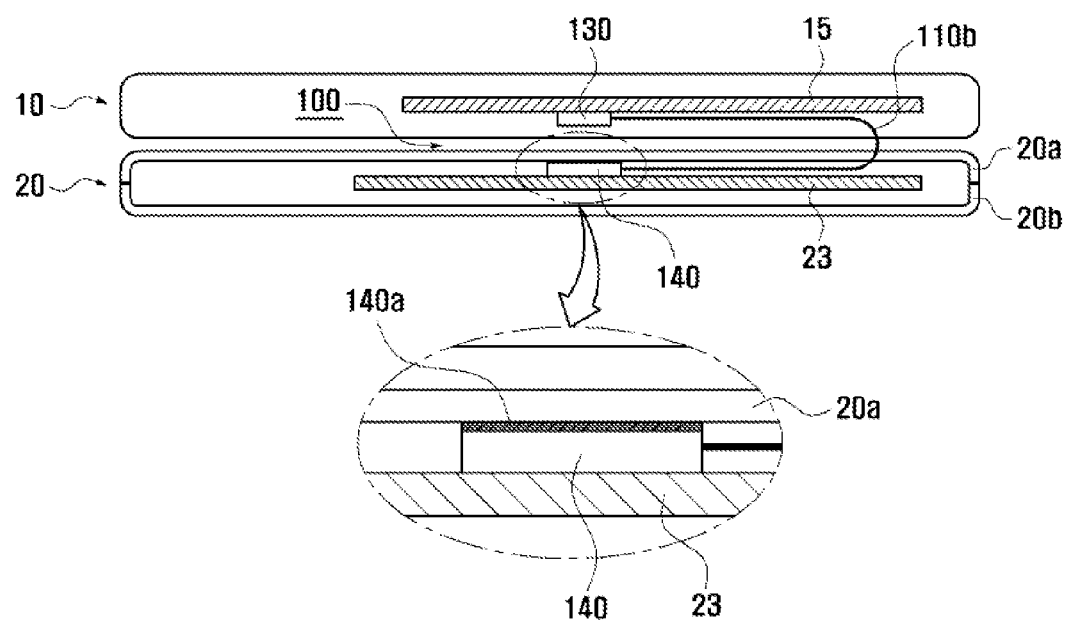
FIG. 5 is a side view illustrating an installed state of the flexible printed circuit board in the mobile terminal having a flexible printed circuit board of FIG. 2 according to an exemplary embodiment of the present invention.

FIG. 3 is a plan view illustrating a configuration of the flexible printed circuit board 100, FIG. 4 is a cross sectional view illustrating the flexible printed circuit board 100 cut along a line A-A' in FIG. 3, and FIG. 5 is a side view illustrating an installed state of the flexible printed circuit board 100 in the mobile terminal 1, according to an exemplary embodiment of the present invention.

Referring to FIGS. 3 and 4, the flexible printed circuit board 100 includes an FPCB connection unit 110, first connector 120, second connector 130 and ground unit 140. FIG. 4 shows a section cut along the line A-A' in FIG. 3.

The FPCB connection unit 110 forms the body of the FPCB 100, and is formed of a flexible printed circuit in which micro circuits are printed on a thin film of a flexible plastic material. The FPCB connection unit 110 may include a plurality of data lines, power lines, and ground lines (not shown), and may have a plurality of layers. The FPCB connection unit 110 connects the first electronic circuit board 23 and second electronic circuit board 15 and operates as a communication path for transmitting various control signals and data signals between the first electronic circuit board 23 and the second electronic circuit board 15. The data line, power line, and ground line of the FPCB connection unit 110 may be made of a copper conductor. Opposite ends of the ground line of the FPCB connection unit 110 may be connected to a ground of the first electronic circuit board 23 and a ground of the second electronic circuit board 15. Because the FPCB connection unit 110 may be variously embodied according to conditions under which it is used, and a configuration of the FPCB connection 110 is well-known, detailed description thereof is omitted here.

The first connector 120 and second connector 130 are formed at opposite ends of the FPCB connection unit 110, and are connected to the first electronic circuit board 23 and second electronic circuit board 15, respectively. Although not shown in the drawings, the first connector 120 and second connector 130 may each include a header and socket including a plurality of terminals. Electromagnetic Interference (EMI) shielding paint may be applied on the first connector 120 and second connector 130 to reduce the influence of static electricity when coupled to the first electronic circuit board 23 and second electronic circuit board 15.

Referring to FIG. 4, the ground unit 140 is formed on the FPCB connection unit 110 between the first connector 120 and second connector 130 and is connected to the ground (not shown) of the first electronic circuit board 23. The ground unit 140 includes an upper ground layer 141 and a lower ground layer 142 that are formed of a thin copper coating layer on the front surface and back surface of the FPCB connection unit 110, respectively. Additionally, the upper ground layer 141, the ground line of the FPCB connection unit 110, and the lower ground layer 142 are connected through a plurality of via holes 143. The plurality of via holes 143 are formed to penetrate the ground line of the FPCB connection unit 110, the upper ground layer 141, and the lower ground layer 142. The upper ground layer 141, the ground line of the FPCB connection unit 110, and the lower ground layer 142 are electrically connected by a metallic filling material filled therein. Accordingly, noise and ESD surges transmitted through the FPCB 100 may be passed to the ground of the first electronic circuit board 23. A configuration and arrangement of the plurality of via holes 143 is shown in FIG. 3 as an example, however other configurations may also be employed.

As described above, a ground between the first electronic circuit board 23 and the second electronic circuit board 15 may be secured sufficiently by forming the ground unit 140 on the FPCB connection unit 110. Additionally, because the noise and ESD surges transmitted through the FPCB 100 may be passed to the ground of the first electronic circuit board 23 through the ground unit 140, influence of the noise and ESD surges to electronic parts installed on the first electronic circuit board 23 may be reduced, thereby enabling improvement of radiation and ESD ability of the mobile terminal 1.

Referring to FIG. 5, the ground unit 140 is installed between the first electronic circuit board 23 and an upper cover 20a of the lower case 20, and is attached to a back surface of the upper cover 20a. When the ground unit 140 is attached to the back surface of the upper cover 20a, the ground unit 140 contacts a ground formed on a surface of the first electronic circuit board 23. The ground unit 140 may be attached to the back surface of the upper cover 20a of the lower case 20 using a conductive tape 140a.

As shown in FIG. 3, the FPCB connection unit 110 includes the ground unit 140, the first connection unit 110a between the first connector 120 and ground unit 140, and the second connection unit 110b between the second connector 130 and ground unit 140. The first connection unit 110a is formed such that, when the ground unit 140 is attached to the back surface of the upper cover 20a of the lower case 20, the first connector 120 protrudes from a side surface of the lower case 20. Because of the above configuration, after the ground unit 140 of the FPCB 100 is attached to the back surface of the upper cover 20a of the lower case 20 and the first electronic circuit board 23 is thereby attached to the upper cover 20a of the lower case 20, the first connector 120 may subsequently be connected to the first electronic circuit board 23. The first connector 120 may be connected to the first electronic circuit board 23 through a connection unit 23a installed on a side of the first electronic circuit board 23 opposite to the side contacted by the ground unit 140. As described above, after the first connection unit 110a of the FPCB connection unit 110 is formed for the first connector 120 to protrude from a side surface of the lower case 20 and the first electronic circuit board 23 is installed on the upper cover 20a of the lower case 20, the first connector 120 is then connected to the first electronic circuit board 23. This arrangement allows for easy assembly of the FPCB 100 regardless of a location of the upper case 10 due to sliding movement. Further, damage to the FPCB 100 such as breakage may be prevented when installed on the mobile terminal 1, and manufacturing time for the mobile terminal 1 may be reduced. This is described in detail later with reference to FIGS. 6a and 6b.

As shown in FIG. 3, the first connection unit 110a may be formed perpendicular to the second connection unit 110b. In this case, when the FPCB 100 is installed in the mobile terminal 1 and connects to the first electronic circuit board 23 and second electronic circuit board 15, the ground unit 140 is installed on the upper cover 20a of the lower case 20, the first connection unit 110a is arranged in a widthwise direction of the mobile terminal 1, and the second connection unit 110b is arranged in a lengthwise direction of the mobile terminal 1. Accordingly, when the ground unit 140 is attached to the back surface of the upper cover 20a of the lower case 20, the first connector 120 may protrude from the side surface of the lower case 20.

FIG. 3 shows an example in which the first connection unit 110a of the FPCB connection unit 110 is perpendicular to second connection unit 110b thereof. However, the first connection unit 110a may be formed in a linear orientation with the second connection unit 110b. For example, if an antenna unit (not shown) of the mobile terminal 1 is installed in a location other than a lower part of the lower case 20 and space in the lower case 20 is available, the second connection unit 110b may be formed such that the second connector 130 protrudes from the lower part of the mobile terminal 1. As described above, the configuration of the FPCB connection unit 110 may be changed depending on conditions including a size and location of an installed electronic circuit board, and a location of installed electronic parts such as an antenna unit.

A process of assembling the FPCB 100 in the mobile terminal 1 is described hereinafter with respect to FIGS. 6A and 6B.

Figure 6A:
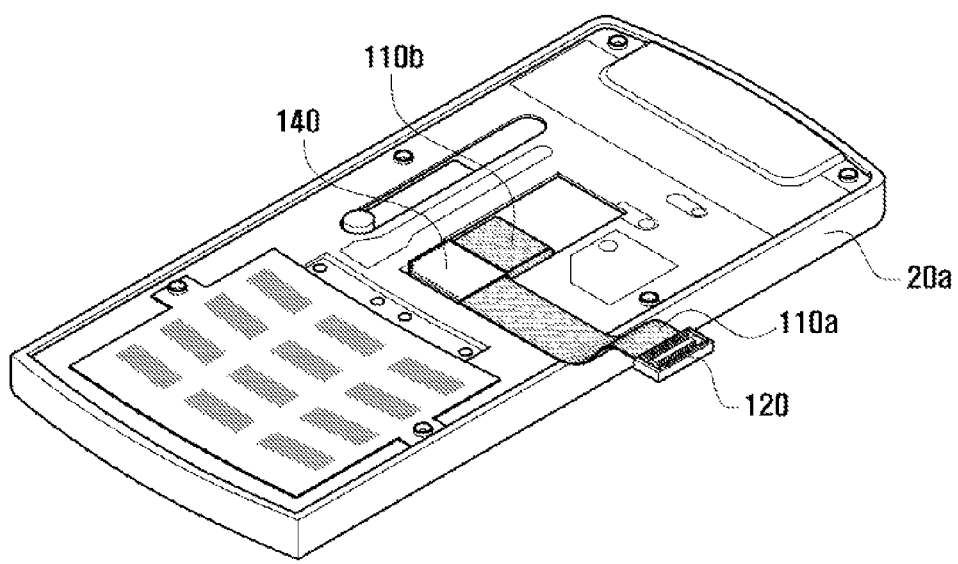
FIGS. 6A and 6B are perspective views illustrating states of assembling the flexible printed circuit board in the mobile terminal having a flexible printed circuit board of FIG. 2 according to an exemplary embodiment of the present invention.
Figure 6B:
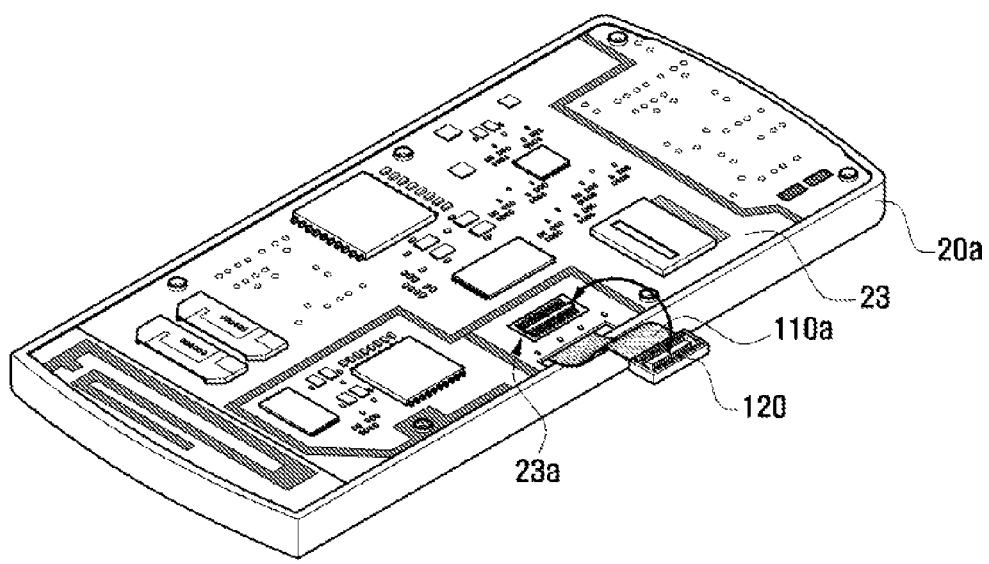

FIGS. 6A and 6B are perspective views illustrating states of assembling the flexible printed circuit board 100 in the mobile terminal 1 according to an exemplary embodiment of the present invention.

Referring to FIGS. 6A and 6B, the display unit 11 of the mobile terminal 1 is shown facing downwards and the lower cover 20b of the lower case 20 is removed for convenience of description. Although not shown in the drawings, the second connector 130 of the FPCB 100 is connected to the second electronic circuit board 15 installed in the upper case 10. The second connection unit 110b penetrates through an opening formed in the sliding hinge 30 and through a corresponding opening formed in the upper cover 20a of the lower case 20. The ground unit 140 is located at the back surface of the upper cover 20a of the lower case 20. As shown in FIG. 5, a surface of the ground unit 140 is attached on the back surface of the upper cover 20a of the lower case 20 by the conductive tape 140a. As shown in FIG. 6B, the FPCB 100 is attached on the back surface of the upper cover 20a of the lower case 20, and the first electronic circuit board 23 may be attached to the upper cover 20a of the lower case 20. The ground unit 140 of the FPCB 100 contacts a ground formed on a surface of the first electronic circuit board 23, and the first connector 120 protrudes through a side surface of the lower case 20. The first connector 120 is connected to the connection unit 23a installed on the side of the first electronic circuit board 23 opposite to the side contacted by the ground unit 140.

As described above, in the mobile terminal 1 having the flexible printed circuit board 100 according to an exemplary embodiment of the present invention, a ground between the first electronic circuit board 23 and second electronic circuit board 15 may be secured sufficiently by forming the ground unit 140 in the FPCB connection unit 110. Additionally, because noise and ESD surges transmitted through the FPCB 100 may be passed through the ground unit 140 to the ground of the first electronic circuit board 23, influence of the noise and ESD surges to electronic parts installed on the first electronic circuit board 23 may be reduced, and radiation and ESD ability of the mobile terminal 1 may be improved. Additionally, by connecting the first connector 120 to the first electronic circuit board 23 after the first connection unit 110a of the FPCB connection unit 110 is formed for the first connector 120 to protrude from a side surface of the lower case 20 and the first electronic circuit board 23 is installed on the upper cover 20a of the lower case 20, the FPCB 100 may be easily assembled irrespective of a location of the upper case 10 due to sliding movement, damage to the FPCB 100 such as breakage may be prevented when installed on the mobile terminal 1, and manufacturing time for the mobile terminal 1 may be reduced.

Exemplary embodiments of the present invention have been described above using the mobile terminal 1 of a slide type. However, the mobile terminal according to exemplary embodiments of the present invention is not limited thereto. Exemplary embodiments of the present invention may be applied to various mobile terminals using the FPCB to connect the first electronic circuit board and second electronic circuit board, such as a slide type mobile terminal, folder type mobile terminal, rotating type mobile terminal, and a combination thereof.

While the invention has been shown and described with reference to certain exemplary embodiments thereof, it will be understood by those skilled in the art that various changes in form and details may be made therein without departing from the spirit and scope of the invention as defined in the appended claims and their equivalents.

What is claimed is:

1. A Flexible Printed Circuit Board (FPCB) installable in an electronic device, the FPCB comprising:
    an L-shape FPCB connection unit including at least one data line, a power line, and a ground line;
    a first connector formed at one end of the L-shape FPCB connection unit and connected to a first electronic circuit board of the electronic device;
    a second connector formed at an end of the L-shape FPCB connection unit opposite that of the end to which the first connector is formed, and connected to a second electronic circuit board of the electronic device; and
    a ground unit formed on the L-shape FPCB connection unit between the first connector and the second connector and connected to a ground of the first electronic circuit board,
    wherein the ground unit comprises an upper ground layer and a lower ground layer on a front surface and a back surface of the FPCB connection unit, respectively, and is connected to the ground of the first electronic circuit board.

2. The FPCB of claim 1, wherein the upper ground layer, a ground line of the FPCB connection unit, and the lower ground layer are electrically connected through at least one via hole by a metallic filling material, wherein a surge transmitted through the FPCB can be passed to the ground of the first electronic circuit board.

3. The FPCB of claim 1, wherein the ground unit is attached to the back surface of the upper cover of the main body unit by a conductive tape.

4. The FPCB of claim 1, wherein the L-shape FPCB connection unit comprises a first connection unit between the first connector and the ground unit, formed such that the first connector protrudes from a side surface of the first electronic circuit board when the ground unit is attached to the back surface of the upper cover of the main body unit.

5. The FPCB of claim 4, wherein the first connector is installed on a side of the first electronic circuit board opposite to a side of the first electronic circuit board contacted by the ground unit.

6. The FPCB of claim 5, wherein the first connection unit of the L-shape FPCB connection unit is formed perpendicular to a second connection unit of the L-shape FPCB connection unit formed between the second connector and the ground unit.

7. The FPCB of claim 1, wherein the ground unit is located between an upper cover of a main body unit of the electronic device and the first electronic circuit board and attached to a back surface of an upper cover of the electronic device.

8. A method of installing a Flexible Printed Circuit Board (FPCB) in an electronic device, the method comprising:
attaching a ground unit of a L-shape FPCB to a back surface of an upper cover of a main body unit of the electronic device, wherein the ground unit comprises an upper ground layer and a lower ground layer on a front surface and a back surface of the FPCB connection unit, respectively;
arranging the L-shape FPCB such that a first connector of the L-shape FPCB protrudes from a side surface of the main body unit;
installing an electronic circuit board on the upper cover; and
connecting the first connector to the electronic circuit board,
wherein the installing of the electronic circuit board comprises attaching a ground of the electronic circuit board to the ground unit.

* * * * *